(12) United States Patent
Ellä et al.

(10) Patent No.: US 6,441,702 B1
(45) Date of Patent: Aug. 27, 2002

(54) METHOD AND SYSTEM FOR WAFER-LEVEL TUNING OF BULK ACOUSTIC WAVE RESONATORS AND FILTERS

(75) Inventors: Juha Ellä, Halikko; Pasi Tikka; Jyrki Kaitila, both of Helsinki, all of (FI)

(73) Assignee: Nokia Mobile Phones Ltd., Espoo (FI)

( * ) Notice: Subject to any disclaimer, the term of this patent is extended or adjusted under 35 U.S.C. 154(b) by 0 days.

(21) Appl. No.: 09/844,264

(22) Filed: Apr. 27, 2001

(51) Int. Cl.⁷ .............................. H03H 3/02; H03H 9/56; H03H 3/04
(52) U.S. Cl. .................. 333/188; 333/189; 333/191; 310/312; 29/25.35; 427/9
(58) Field of Search ................ 333/186–192; 310/312; 29/25.35; 204/192.33, 192.34; 427/9, 100

(56) References Cited

U.S. PATENT DOCUMENTS

| | | | | |
|---|---|---|---|---|
| 4,638,536 A | * | 1/1987 | Vig | 29/25.35 |
| 5,382,930 A | * | 1/1995 | Stokes et al. | 333/191 |
| 5,894,647 A | * | 4/1999 | Lakin | 29/25.35 |
| 6,051,907 A | * | 4/2000 | Ylilammi | 310/312 |
| 6,081,171 A | | 6/2000 | Ella | 333/189 |
| 6,307,447 B1 | * | 10/2001 | Barber et al. | 333/189 |
| 6,339,276 B1 | * | 1/2002 | Barber et al. | 310/312 |

FOREIGN PATENT DOCUMENTS

| | | | | |
|---|---|---|---|---|
| JP | 60-170312 | * | 9/1985 | |
| JP | 3-16308 | * | 1/1991 | 333/187 |

* cited by examiner

*Primary Examiner*—Justin P. Bettendorf
*Assistant Examiner*—Barbara Summons
(74) *Attorney, Agent, or Firm*—Ware, Fressola, Van der Sluys & Adolphson LLP

(57) ABSTRACT

A method and system for tuning a bulk acoustic wave device at the wafer level by adjusting the thickness of the device. In particular, the thickness of the device has a non-uniformity profile across the device surface. A mask having a thickness non-uniformity profile based partly on the thickness non-uniformity profile of the device surface is provided on the device surface for etching. A dry etching method is used to remove part of the mask to expose the underlying device surface and further removed the exposed device surface until the thickness non-uniformity of the device surface falls within tolerance of the device.

27 Claims, 10 Drawing Sheets

METHOD AND SYSTEM FOR WAFER-LEVEL TUNING OF BULK ACOUSTIC WAVE RESONATORS AND FILTERS

FIELD OF THE INVENTION

The present invention relates generally to bulk acoustic wave resonators and filters and, more particularly, to the tuning of such resonators and filters.

BACKGROUND OF THE INVENTION

It is known that a bulk acoustic-wave (BAW) device is, in general, comprised of a piezoelectric layer sandwiched between two electronically conductive layers that serve as electrodes. When a radio frequency (RF) signal is applied across the device, it produces a mechanical wave in the piezoelectric layer. The fundamental resonance occurs when the wavelength of the mechanical/acoustic wave (produced by the RF signal) is about twice the thickness of the piezoelectric layer. Although the resonant frequency of a BAW device also depends on other factors, the thickness of the piezoelectric layer is the predominant factor in determining the resonant frequency. As the thickness of the piezoelectric layer is reduced, the resonant frequency is increased. BAW devices have traditionally been fabricated on sheets of quartz crystals. In general, it is difficult to achieve a device of high resonant frequency using this fabrication method. When fabricating BAW devices by depositing thin-film layers on passive substrate materials, one can extend the resonant frequency to the 0.5–10 GHz range. These types of BAW devices are commonly referred to as thin-film bulk acoustic resonators or FBARs. There are primarily two types of FBARs, namely, BAW resonators and stacked crystal filters (SCFs). The difference between these two types of devices lies mainly in their structures. An SCF usually has two or more piezoelectric layers and three or more electrodes, with some electrodes being grounded. FBARs are usually used in combination to produce passband or stopband filters. The combination of one series FBAR and one parallel or shunt FBAR makes up one section of the so-called ladder filter. The description of ladder filters can be found, for example, in Ella (U.S. Pat. No. 6,081,171). As disclosed in Ella, an FBAR-based device may have one or more protective layers commonly referred to as the passivation layers. A typical FBAR-based device is shown in FIG. 1. As shown in FIG. 1, the FBAR device 1 comprises a substrate 2, a bottom electrode 4, a piezoelectric layer 6, a top electrode 8 and a passivation layer 10. The FBAR device 1 may additionally include an acoustic mirror layer 12, which is comprised of a layer 16 of high acoustic impedance sandwiched between two layers 14 and 18 of low acoustic impedance. The mirror usually, but not always, consists of pairs of high and low impedance layers (even number of layers). Some mirrors consist of two pairs of such layers arranged in a sequence like $SiO_2$, W, $SiO_2$, W. Instead of the mirror, an FBAR device may additionally include one or more membrane layers of $SiO_2$ and a sacrificial layer. The substrate 2 can be made from silicon (Si), silicon dioxide ($SiO_2$), Galium Arsenide (GaAs), glass, or ceramic materials. The bottom electrode 4 and top electrode 8 can be made of gold (Au), molybdenum (Mo), tungsten (W), copper (Cu), nickel (Ni), Niobium (Nb), silver (Ag), tantalum (Ta), cobalt (Co), aluminum (Al), titanium (Ti) or other electrically conductive materials. The piezoelectric layer 6 can be made of zinc oxide (ZnO), zinc sulfide (ZnS), aluminum nitride (AlN), lithium tantalate ($LiTaO_3$) or other members of the so-called lead lanthanum zirconate titanate family. The passivation layer 10 can be made of a dielectric material, such as $SiO_2$, $Si_3N_4$ and polyimide to serve as an electrical insulator and to protect the piezoelectric layer. The low acoustic impedance layers 14 and 18 can be made of Si, $SiO_2$, poly-silicon, Al or a polymer. The high acoustic impedance layer 16 can be made from Au, Mo or W, and in some cases, dielectric such as aluminum nitride (AlN) to make a number of layer pairs. FBAR ladder filters are typically designed so that the series resonators yield a series resonance at a frequency that is approximately equal to, or near, the desired, or designed, center frequency of the respective filters. Similarly, the shunt, or parallel, resonators yield a parallel resonance at a frequency slightly offset from the series FBAR resonance. The series resonators are usually designed to have their maximum peak in transmission at the center frequency, so signals can be transmitted through the series resonators. In contrast, the shunt resonators are designed to have their minimum in transmission, so signals are not shorted to ground. FBARs yield parallel resonance and series resonance at frequencies that differ by an amount that is a function of a piezoelectric coefficient of the piezoelectric materials used to fabricate the devices, in addition to other factors such as the types of layers and other materials employed within in the device. In particular, FBAR ladder filters yield passbands having bandwidths that are a function of, for example, the types of materials used to form the piezoelectric layers of the resonators and the thickness of various layers in the device.

The difference in the thickness in various layers in the device can be achieved during the fabrication of the device. Presently, FBARs are fabricated on a glass substrate or a silicon wafer. The various layers in the FBAR-based device are sequentially formed by thin-film deposition. In an FBAR-based device, the resonant frequency of the device usually has to be controlled to within a 0.2–0.5% tolerance. This means that the thickness of each layer in the device must be controlled in the same way. It is known that, however, the deposition of thin-film layers is difficult to control to yield a thickness within such tolerance when the area of substrate or wafer is large. For that reason, manufacturers of FBAR-based devices use wafers of 4-inches or less in diameter for device fabrication. With a small wafer or substrate, certain thickness non-uniformity can be accepted without losing many components due to the operation frequency being out of specification. However, fabricating devices on small wafers or substrates is less cost-effective than doing the same on large substrates. In the case of using large substrates, the problem associated with thickness non-uniformity becomes acute.

Thus, it is advantageous and desirable to provide a method and system to solve the problem associated with thickness non-uniformity in the fabrication of FBAR-based devices on large substrates or wafers.

SUMMARY OF THE INVENTION

It is a primary object of the present invention to provide a method and system for achieving the desired resonant frequency of the device within a certain tolerance. This object can be achieved by correcting for the thickness non-uniformity of the devices fabricated on large substrates. The thickness variations can be corrected by selectively removing material from the surface area of a wafer (with one or more layers of the device already deposited thereon), or die, before the wafer is cut into individual chips. In that context, the bulk acoustic wave device, as described herein, refers to the entire wafer or substrate that has one or more layers deposited thereon to form one or more individual chips, or part of such wafer or substrate. Moreover, the bulk acoustic wave devices referred to herein include bulk acoustic wave resonators, stacked crystal filters, any combination of the resonators and filters, and the structural variations of the resonators and filters. Furthermore, although one or more layers are already formed on the substrate, the device may or may not have all the necessary layers or the patterns of the layers, when the thickness of the device is adjusted. For example, the topmost layer on the substrate may be the piezoelectric layer, the top electrode or another layer.

Thus, according to the first aspect of the present invention, a method of tuning a bulk acoustic wave device comprising a substrate and a plurality of acoustic wave generating and controlling layers formed on the substrate, wherein the device has a top surface layer made of a surface material and a surface layer thickness with a thickness non-uniformity profile across the top surface layer, and wherein the device has an operating frequency which varies partly with the surface layer thickness and the operating frequency can be adjusted by adjusting the thickness of the top surface layer. The method comprises the steps of:

- providing, on top of the top surface layer, a mask made from a mask material having a further non-uniformity profile partly based on the thickness non-uniformity of the top surface layer;
- providing an etching agent over the mask for removing the mask material from at least one mask area to expose a corresponding surface area of the top surface layer to the etching agent; and
- removing part the of surface material from the top surface layer at the exposed surface area until a desired thickness of the top surface layer is reached, while simultaneously removing the mask material to modify the exposed surface area.

The top surface layer of the device can be any one of the acoustic wave generating and controlling layers and one or more layers can be fabricated on top of the top surface after the desired thickness of the top surface layer is achieved. Thus, the top surface layer can be a top electrode layer, a piezoelectric layer or a passivation layer.

Preferably, the mask material is a photoresist material, and the further non-uniformity of the mask is achieved by controlling the exposure depth of the photoresist material to a light beam, wherein the exposure depth varies based partly on the thickness non-uniformity of the top surface layer.

It is possible to control the intensity profile of the light beam to achieve the controlled exposure depth.

It is possible to introduce a pigment into the photoresist material to attenuate the light beam for controlling the exposure depth.

It is possible that the mask material is a dielectric material, and the further non-uniformity of the mask is achieved by trimming the dielectric material in a laser ablation process.

It is possible that the thickness non-uniformity of the top surface layer comprises a plurality of locations at which the top surface layer requires thickness adjustment, and the mask has a plurality of sections corresponding to the plurality of locations of the top surface layer, and wherein the mask material is selectively removed at the plurality of sections to provide the further non-uniformity profile of the mask.

Preferably, the mask material is a dielectric material, and a laser beam is used to selectively remove the plurality of sections of the mask.

Preferably, the etching agent comprises an ion beam for use in an ion beam etching process.

It is possible that the etching agent comprises a reactive ion beam for use in a reactive ion etching process.

It is also possible that the etching agent comprises an ion beam and one or more chemical agents for use in a chemically assisted ion beam etching process.

It is preferable to map the thickness of the device to determine the thickness non-uniformity profile of the device surface prior to providing the mask on top of the top surface layer, wherein the mapping can be carried out with a thickness profile measurement device or a resonant frequency measurement device.

According to the second aspect of the invention, a system for tuning a bulk acoustic wave device comprising a substrate and a plurality of acoustic wave generating and controlling layers formed on the substrate, wherein the device has a top surface layer made of a surface material and a thickness with a thickness non-uniformity profile across the top surface layer, and wherein the bulk acoustic wave device has an operating frequency, which varies partly with a thickness of the top surface layer, and the operating frequency can be adjusted by adjusting the thickness of the top surface layer through a mask made of a mask material provided on top surface layer. The system comprises:

- means, positioned above the device, for removing the mask material for providing a further non-uniformity profile of the mask partly based on the thickness non-uniformity of the top surface layer; and
- means, positioned above the mask, for providing an etching agent over the mask for removing the mask material from at least one mask area to expose a corresponding surface area of the top surface layer to the etching agent, and for removing part of the surface material from the top surface layer at the exposed surface area until a desired thickness of the top surface layer is reached, while simultaneously removing the mask material to modify the exposed surface area.

Preferably, the mask material is a photoresist material and the system further comprises a light source to expose the photoresist material, wherein the light source has a non-uniformity intensity profile to control the exposure depth of the photoresist material across the device surface.

It is possible that the mask material is a dielectric material and the system further comprises a laser light source for trimming the dielectric material, and means for varying the light beam intensity across the device surface.

It is also possible to move the laser light source in a lateral direction relative to the device surface to trim the dielectric material one spot at a time.

It is also possible that the thickness non-uniformity profile of the top surface layer comprises a plurality of locations at which the top surface layer requires thickness adjustment, and the mask comprises a plurality of sections corresponding to the plurality of locations, and the laser light source selectively removes the dielectric material at the plurality of sections of the mask for providing the further non-uniformity profile.

It is possible that the mask material is a dielectric material and the system further comprises a particle beam for removing the dielectric material according to the non-uniformity profile of the mask. The particle beam can be an ion beam for use in an ion beam etching process, a reactive ion beam for use in a reactive ion beam etching process, an ion beam for use in a chemically assisted ion beam etching process, or a beam for use in a sputtering process.

Preferably, the system also comprises a mechanism of mapping the thickness non-uniformity profile of the device surface prior to adjusting the thickness. Preferably, the mapping mechanism comprises a frequency measurement device for measuring the frequency at different locations of the device surface. It is also possible to use a thickness measurement device to determine the amount of material to be removed at different locations.

The present invention will become apparent upon reading the description taken in conjunction with FIGS. 2 to 12.

DETAILED DESCRIPTION

Figure 1:
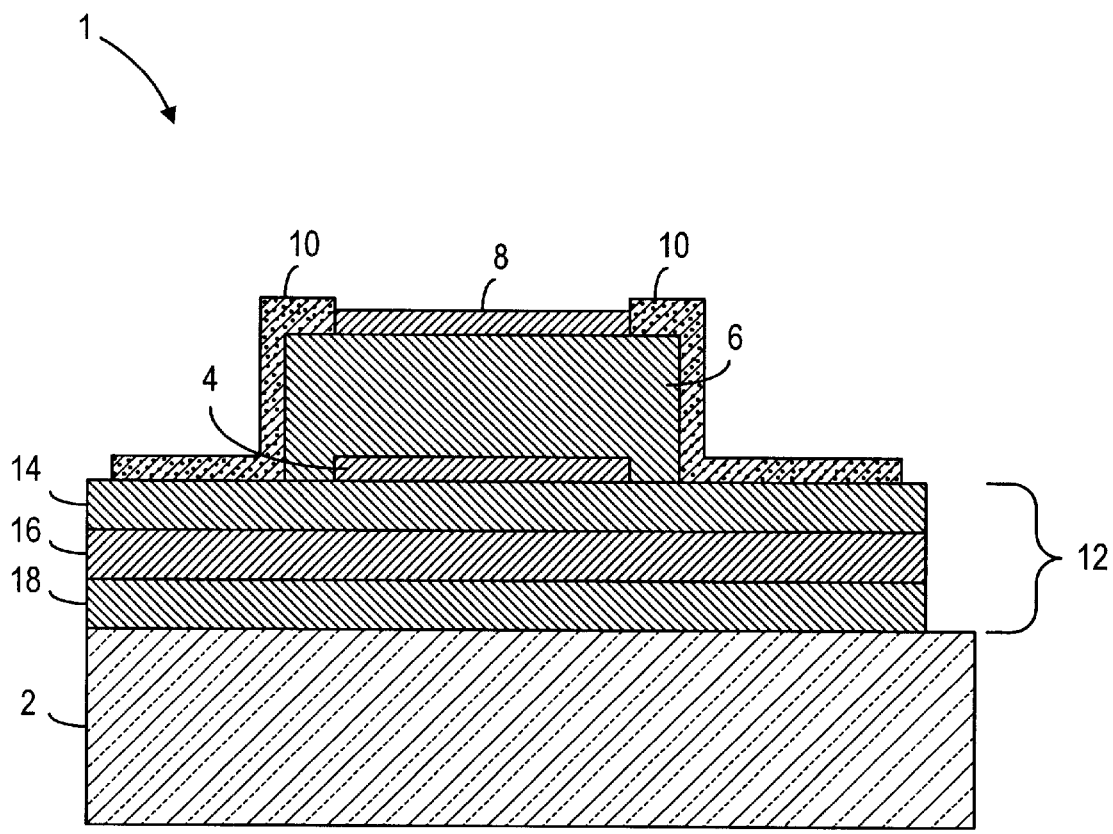
FIG. 1 is a cross sectional view of a typical bulk acoustic wave device illustrating a plurality of layers formed on a substrate.
Figure 2:
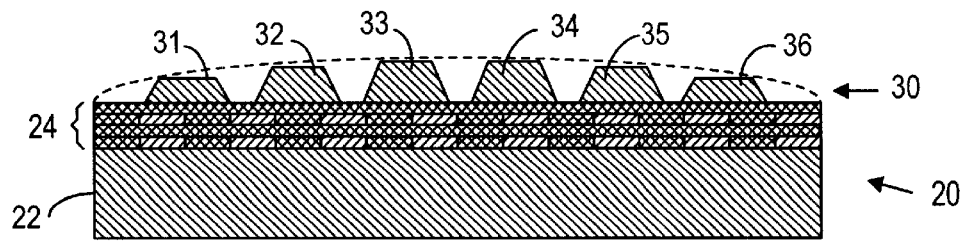
FIG. 2 is a cross sectional view of a simplified bulk acoustic wave device illustrating the thickness non-uniformity of the top surface layer of the device.
Figure 11:
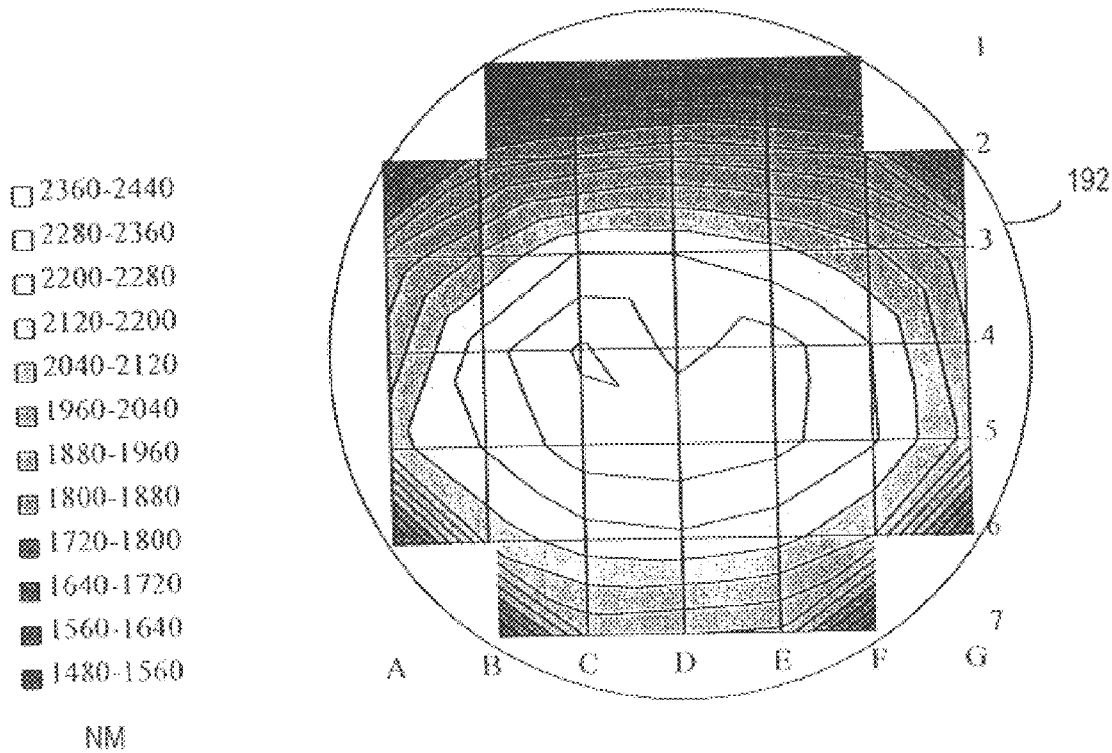
FIG. 11 is a thickness chart illustrating the non-uniformity thickness profile of a wafer with a plurality of acoustic wave generator and control layers fabricated thereon.

FIG. 2 is a cross sectional view illustrating a bulk acoustic wave device 20 having a top surface layer 30 and a plurality of mirror layers 24 formed on a substrate 22. Some of the mirror layers are patterned. The substrate 22 can be made of Si, GaAs, glass or other material. The top surface layer 30 may comprise a plurality of resonators having top and bottom electrodes, but it may represent a piezoelectric layer, a bottom electrode layer or a top electrode layer. When a bulk acoustic wave generating or controlling layer is formed on a wafer in a thin-film deposition process, the layer is usually thicker in the center portion than the edge portion (FIG. 11). The thickness non-uniformity of the top surface layer 30 may exceed the tolerance allowed for the spread in the resonant frequency of the device 20. Thus, it is desirable to remove part of the top surface layer 30 so that the non-uniformity profile of the reduced surface falls within the tolerance. To illustrate the problem associated with the thickness non-uniformity profile of the top surface layer, a plurality of resonators 31–36 with different thicknesses are shown in FIG. 2. The thickness non-uniformity profile of the top surface layer 30, however, can be reduced by reducing the thickness of some of the resonators so that the frequency of each resonator falls within the tolerance.

In order to reduce the thickness non-uniformity of the top surface layer 30 of the device 20, a non-uniform etching mask will be provided on top of the top layer 30 for etching. FIGS. 2–5 show the process of preparing such a non-uniform etching mask. Preferably, a photoresist layer 40 is provided on the top surface layer 30 of the device 20. A light source 100 is used to expose the photoresist layer 40 in order to reduce the thickness of the photoresist layer 40 in a controlled manner to produce an etching mask 44, as shown in FIG. 5. As shown in FIG. 5, the etching mask 44 has a non-uniformity profile partly in complement to the thickness non-uniformity of the top surface layer 30. If it is desirable to reduce the thickness of the top surface layer 30 more in the middle portion thereof than the edge portion, it is possible to produce an etching mask that is thinner in the middle portion than the edge portion (see FIG. 5). Accordingly, the exposure depth of the photoresist layer 40 should be made greater in the middle portion than the edge portion. One way to achieve this exposure depth difference is to give the middle portion of the photoresist layer 40 a stronger exposure dose than the edge portion using a non-uniform light beam 102, as shown in FIG. 4. The exposed portion of the photoresist layer 40 is denoted by reference numeral 42. As shown, the light beam 102 has a non-uniform intensity profile. It is possible to use a beam forming device (not shown) or a non-uniform optical filter (not shown) to achieve the non-uniform light beam 102. After the exposed photoresist layer 40 is developed and washed, a non-uniform etching mask 44 is obtained, as shown in FIG. 5.

Figure 6A:
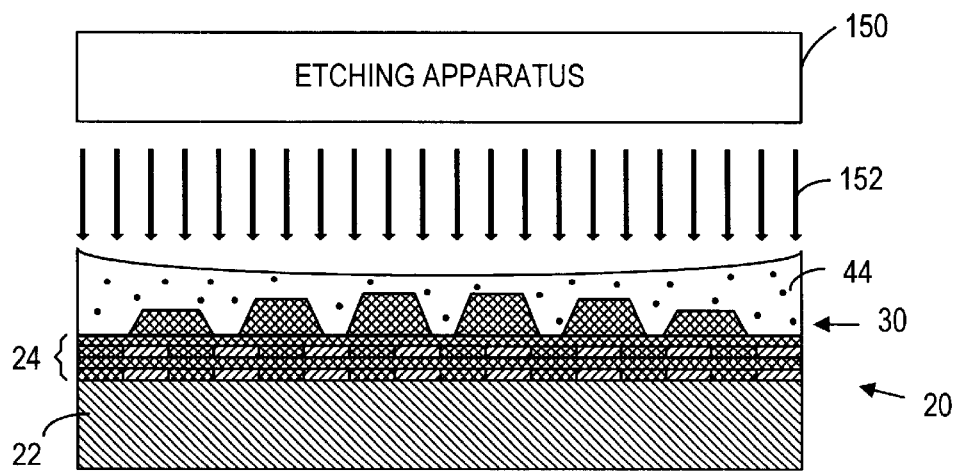
FIG. 6a is diagrammatic representation illustrating part of the etching mask being removed by an etching agent in an etching process.
Figure 6B:
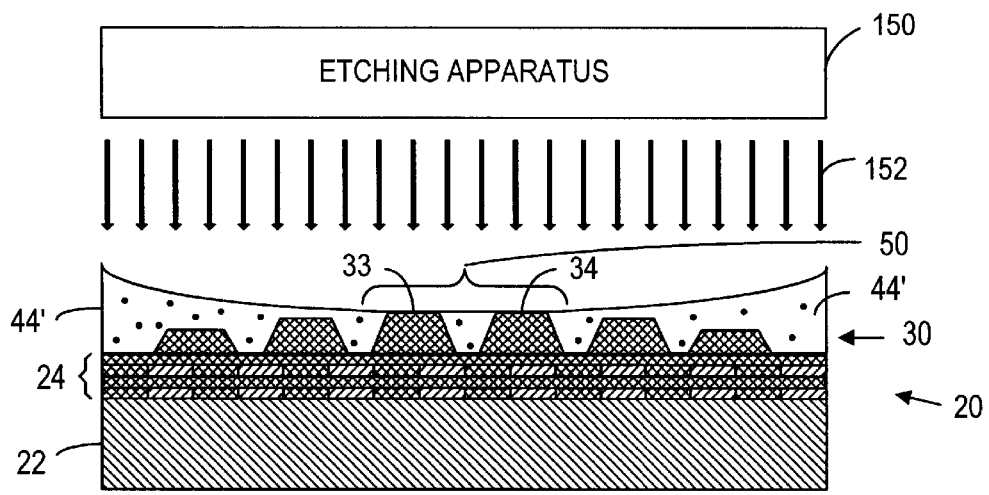
FIG. 6b is a diagrammatic representation illustrating the exposed section of the top surface layer and the etching mask being further reduced in the etching process.
Figure 6C:
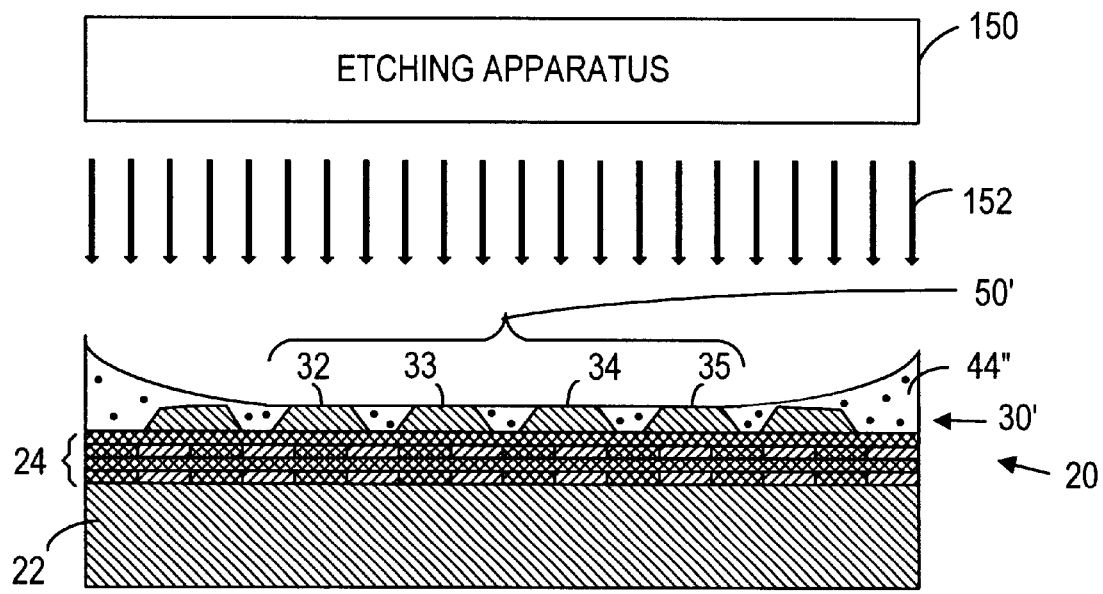
FIG. 6c is a diagrammatic representation illustrating a substantial portion of the top surface layer and most of the etching mask being removed in the etching process.
Figure 7:
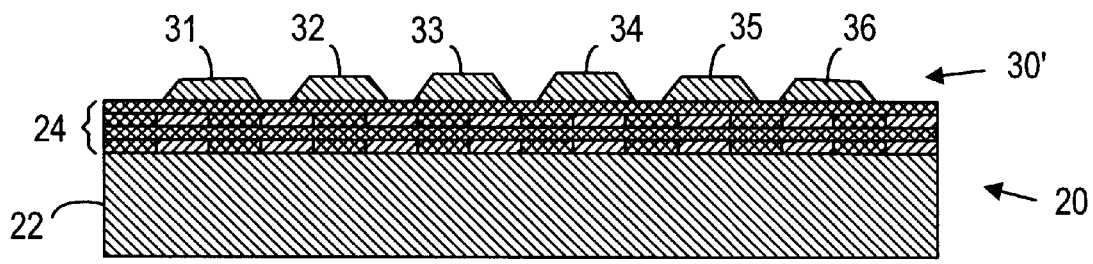
FIG. 7 is a cross sectional view of the bulk acoustic wave device showing the top surface layer after the etching mask is stripped.

Together with the etching mask 44, the device 20 is placed under an etching apparatus 150 for etching, as shown in FIG. 6a. For example, if the etching apparatus 150 is used for ion-beam etching (IBE), then the etching agent is an ion beam denoted by reference numeral 152. Likewise, a reactive ion beam can be used in a reactive ion etching (RIE)

process, and an ionized argon gas and chlorine can be used in a chemically-assisted, ion-beaming etching (CAIBE) process. The beam 152 can be uniform or non-uniform. As the beam 152 encounters a surface, it removes part of it. Thus, part of the etching mask 44 is etched away to become a cleared section 50, exposing part of the top surface layer 30 to the beam 152. As shown in FIG. 6b, the resonators 33 and 34 are now exposed to the beam 152. As the exposed section of the top surface layer 30 and the remaining portion 44' of the etching mask 44 are subject to further etching, the thickness of the resonators 33 and 34 is reduced and the cleared section 50 of the etching mask widened. As shown in FIG. 6c, when the remaining mask portion 44' is further reduced to become a thinner portion 44" having a cleared section 50', the thickness non-uniformity of the reduced top surface layer 30' falls within the tolerance. Accordingly, it may not be necessary to remove the reduced top surface layer 30' further. As shown in FIG. 6c, although the thickness of the resonators 31–36 may not be the same, the spread in the resonant frequency of the device falls within the specification. Thus, when the desired uniformity is reached, the remaining part 44" of the etching mask is stripped. The resulting top surface layer 30' is shown in FIG. 7.

Figure 8A:
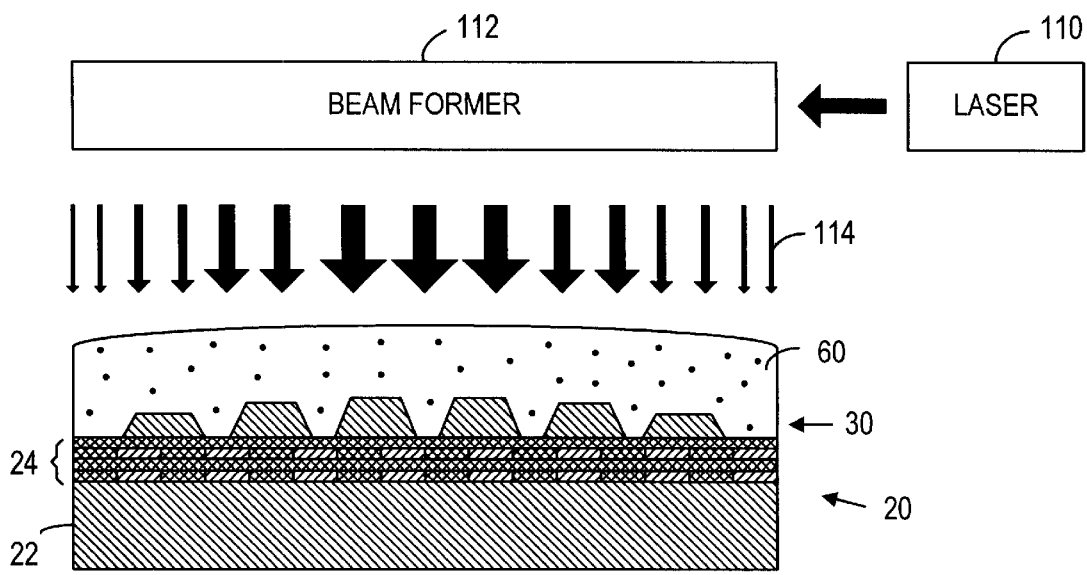
FIG. 8a is a diagrammatic representation illustrating a laser light source having a non-uniform intensity profile being used to reduce the top surface of a dielectric mask.
Figure 8B:
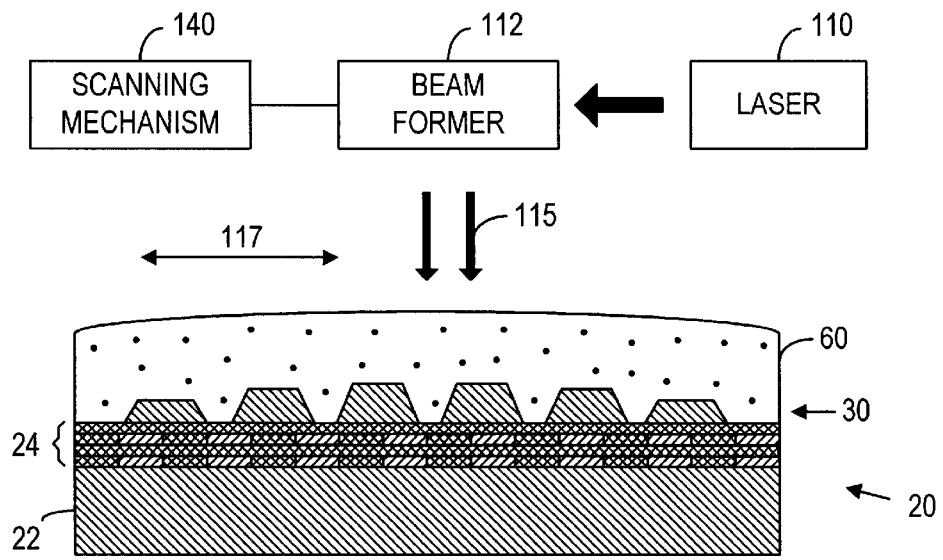
FIG. 8b is a diagrammatic representation illustrating a laser light source and a scanning mechanism being used to reduce the top surface of a dielectric mask.
Figure 8C:
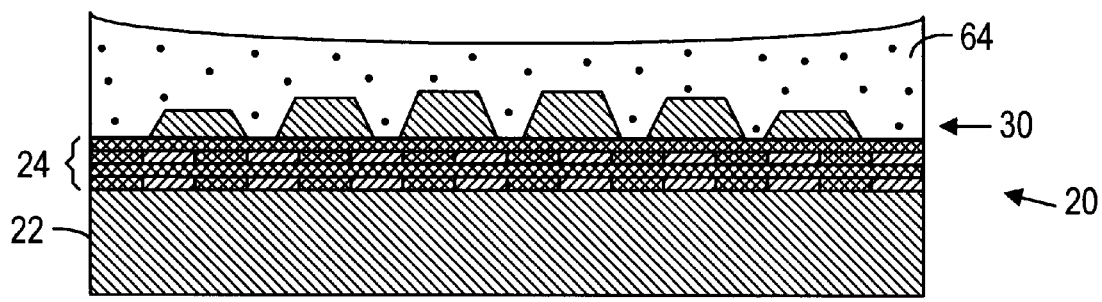
FIG. 8c is a cross sectional view illustrating a dielectric mask having a thickness non-uniformity profile partly based on the thickness non-uniformity of the top surface of the device.
Figure 9A:
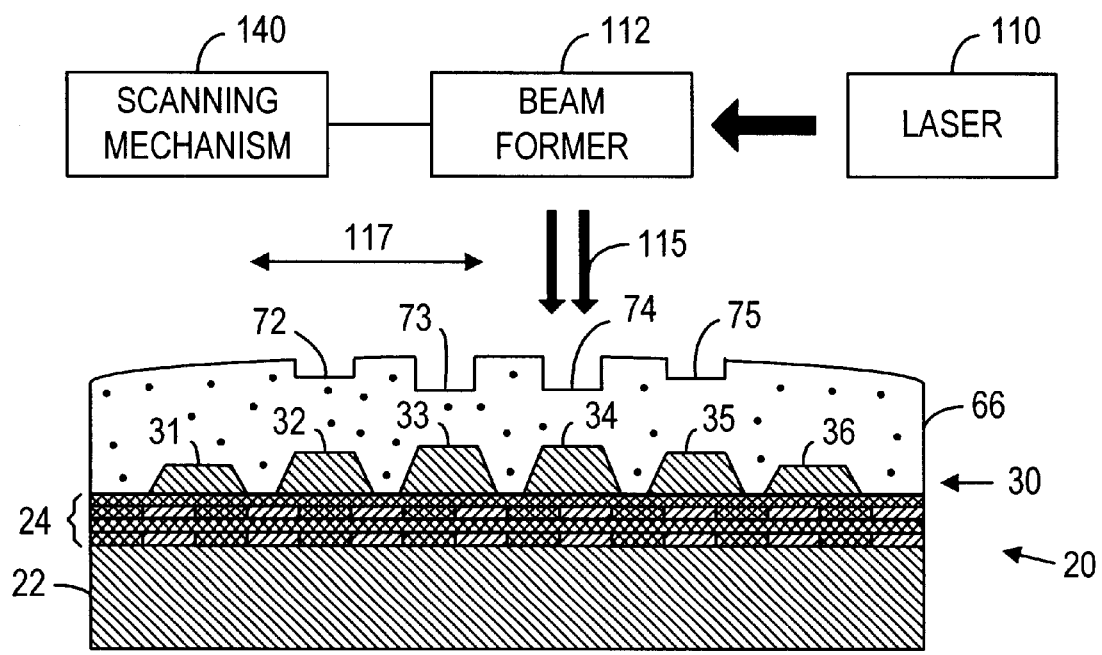
FIG. 9a is a cross sectional view illustrating a laser beam used to selectively remove a plurality of sections of the etching mask.

In the process, as described in conjunction with FIGS. 3 to 6c, an etching mask made of a photoresist material is used. It is possible to use a dielectric material for the etching mask. For example, a dielectric layer 60 is provided on top of the top surface layer 30, as shown in FIG. 8a. The dielectric layer 60 can be trimmed or reduced by a laser beam in a laser ablation process. As shown, a laser 110 is used to provide a laser beam to a beam-forming device 112 so that the output beam 114 is non-uniform. Alternatively, a narrower laser beam 115 is used to trim the dielectric layer 60 one spot at a time and a scanning mechanism 140 is used to move the laser beam 115 in a lateral direction to other locations, as denoted by arrow 117. The goal is to produce a non-uniform etching mask 64, as shown in FIG. 8c. The top surface layer 30, along with the etching mask 64, is subject to etching, similar to the process steps illustrated in FIGS. 6a–6c. It should be noted that it is also possible to use other method to produce a non-uniform etching mask for selectively removing part of the top surface layer 30. For example, an ion beam can be used to reduce the thickness of a dielectric layer one spot at a time to produce a non-uniform etching mask, similar to the etching mask 64 as shown in FIG. 8c. It is also possible to use a laser beam 115, as shown in FIG. 9a, to selectively remove the etching mask 66 at a plurality of sections 72–75, one section at a time. The plurality of sections 72–75 are corresponding to the locations 32–35 of the top surface layer 30 where the top surface layer requires thickness adjustment. As shown in FIG. 9a, the depth of the sections 72–74 may not be the same.

The depth varies with the thickness adjustment required at locations 32–35. Thus, it can be said that the thickness non-uniformity profile of the etching mask 66 is based on the thickness non-uniformity profile of the top surface layer 30 of the device 20.

Figure 9B:
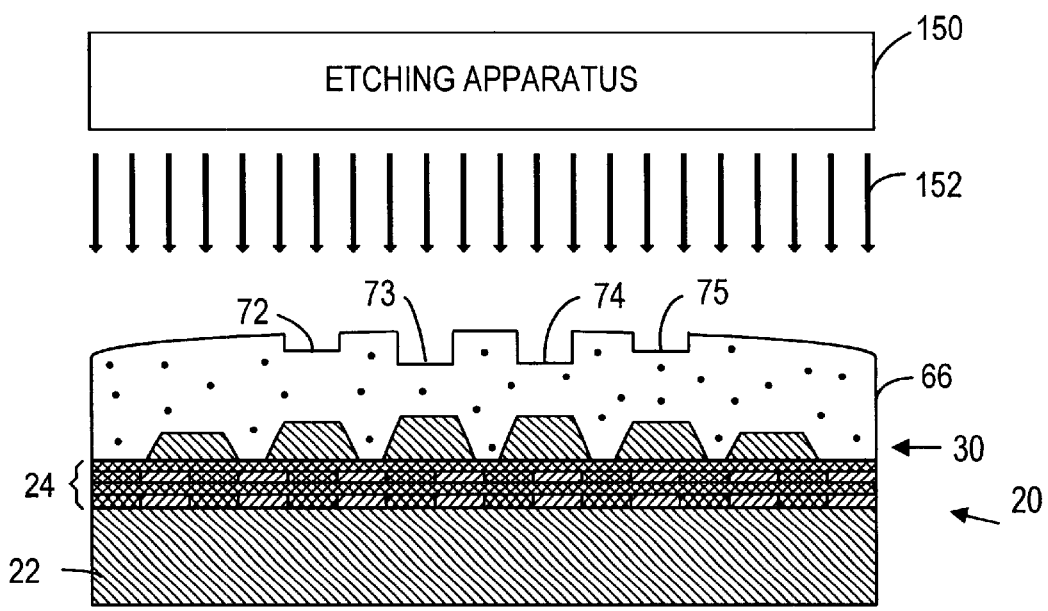
FIG. 9b is a cross section view illustrating part of the etching mask of FIG. 9a being removed by an etching agent in an etching process.
Figure 9C:
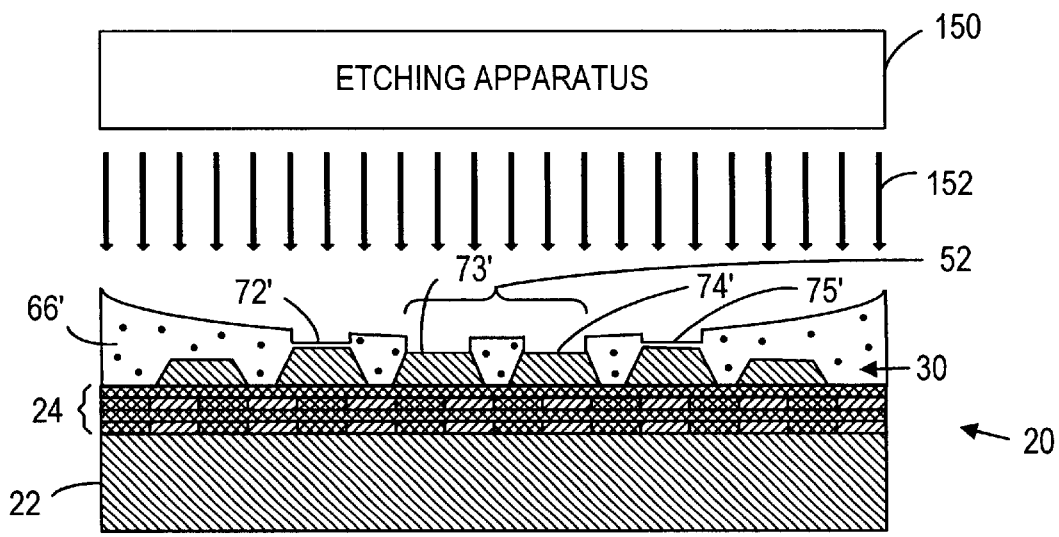
FIG. 9c is a diagrammatic representation illustrating the exposed section of the top surface layer and the etching mask of the FIG. 9a being further reduced in the etching process.

Together with the etching mask 66, the device 20 is placed under an etching apparatus 150 having an etching beam 152 for etching, as shown in FIG. 9b. As the beam 152 encounters the etching mask 66, it removes part of it. As shown in FIG. 9c, the remaining portion 66' of the mask has a cleared section 52, exposing. the resonators 33 and 34 to the beam 152. The removed sections 72–75 of the mask 60 are also reduced to sections 72'–75' by the etching beam 152. The process continues until a desired thickness uniformity of the top surface layer 30 is reached.

Figure 10A:
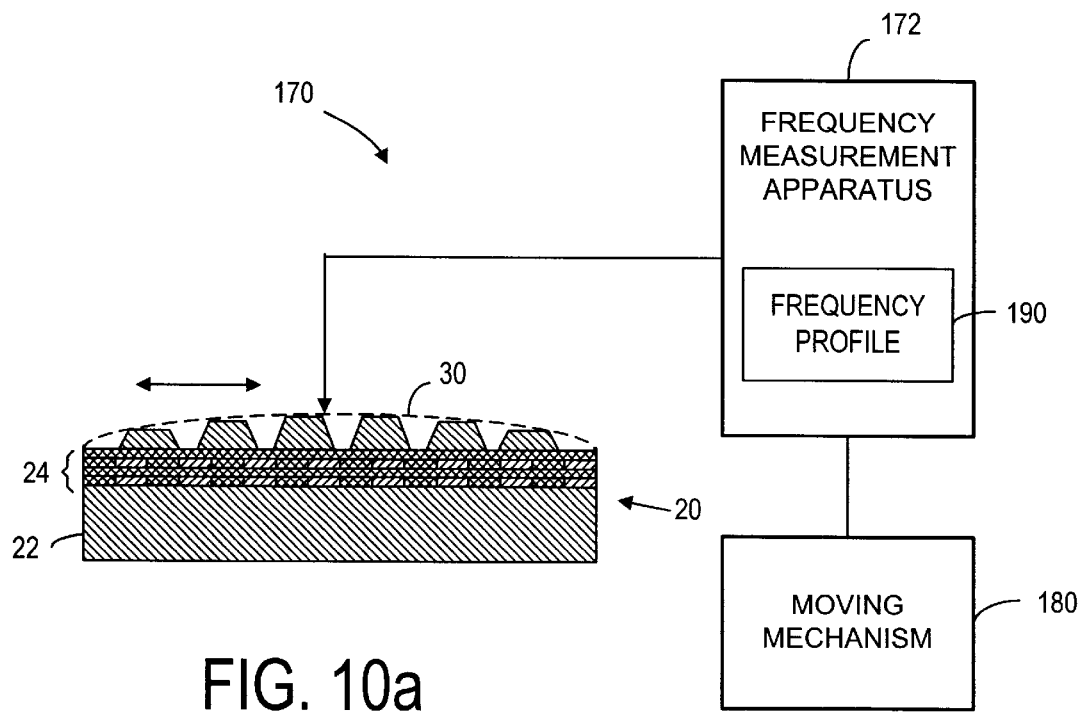
FIG. 10a is a diagrammatic representation illustrating a system for mapping a bulk acoustic wave device by measuring the resonant frequency, according the present invention.

Prior to producing an etching mask 44, 64 or 66 on the top surface layer 30, as shown in FIGS. 5a, 8c and 9a, it is preferred that the thickness non-uniformity of the top surface layer 30 be mapped. It is preferable to use a frequency measurement apparatus 172 to perform localized measurement of the resonant frequency of the device 20, as shown in FIG. 10a. It may be necessary to measure the resonant frequency of the individual resonators 31–36 of the device 20. It should be noted that, in order to measure the resonant frequency of those components, it is necessary to form and pattern the top electrode layer on the wafer. Based on the frequency profile 190, it is possible to calculate the amount of material to be removed from the top surface layer 30. As shown in FIG. 10a, the profile mapping system 170 comprises a frequency measurement apparatus 172, and a moving mechanism 180 for moving the frequency measurement apparatus 172 relative to the device 20 for obtaining the frequency profile 190 of the device 20. From the frequency profile 190 it is possible to obtain the thickness non-uniformity profile 192 (FIG. 11).

Figure 10B:
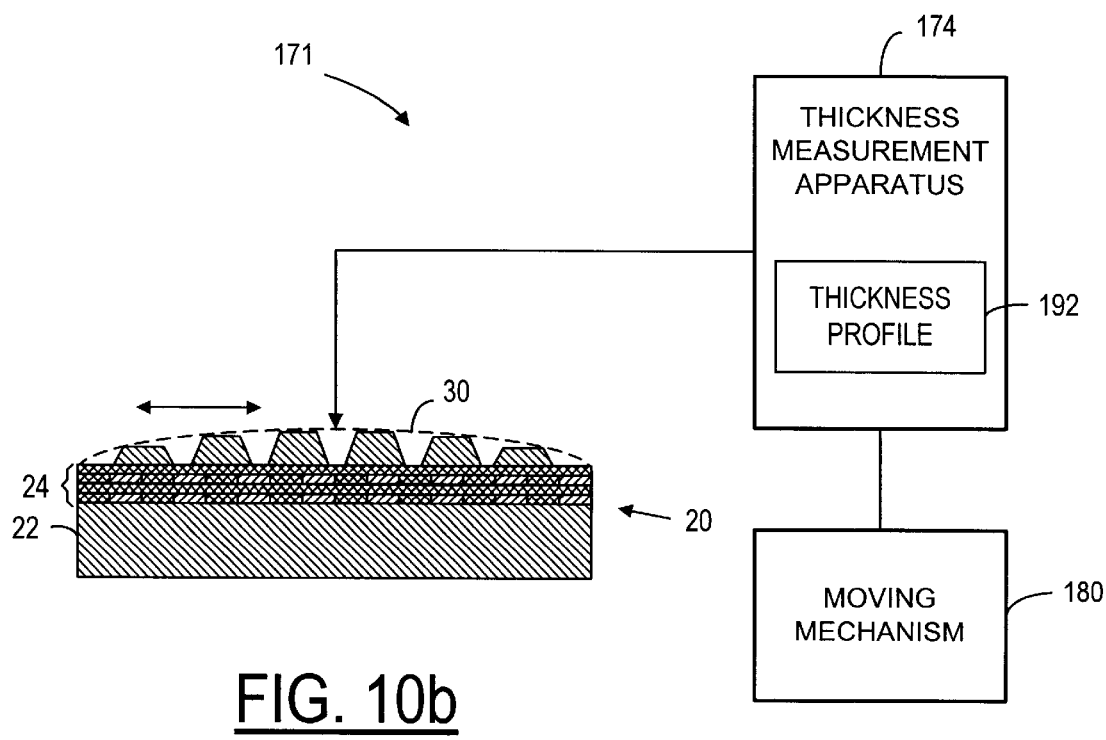
FIG. 10b is a diagrammatic representation illustrating a system for mapping a bulk acoustic wave device by measuring the physical thickness of the device, according to the present invention.

FIG. 10b is a diagrammatic representation illustrating a system 171 for mapping a bulk acoustic wave device by measuring the physical thickness of the device. Instead of a frequency measurement apparatus 172, a thickness measurement apparatus 174 is used to measure the thickness of the device 20 directly.

FIG. 11 is a thickness chart illustrating the non-uniformity thickness profile of a wafer with a plurality of acoustic wave generating and controlling layers fabricated thereon. In particular, FIG. 11 shows the non-uniformity profile of a piezoelectric (ZnO) layer expressed in terms of nanometers. If the average thickness is used as a reference, then the thickness variation across the layer is about ±23%. With such a large variation in thickness, the frequency variation across the wafer is usually not acceptable. Thus, the device must be tuned by adjusting the thickness of the device.

Figure 12:
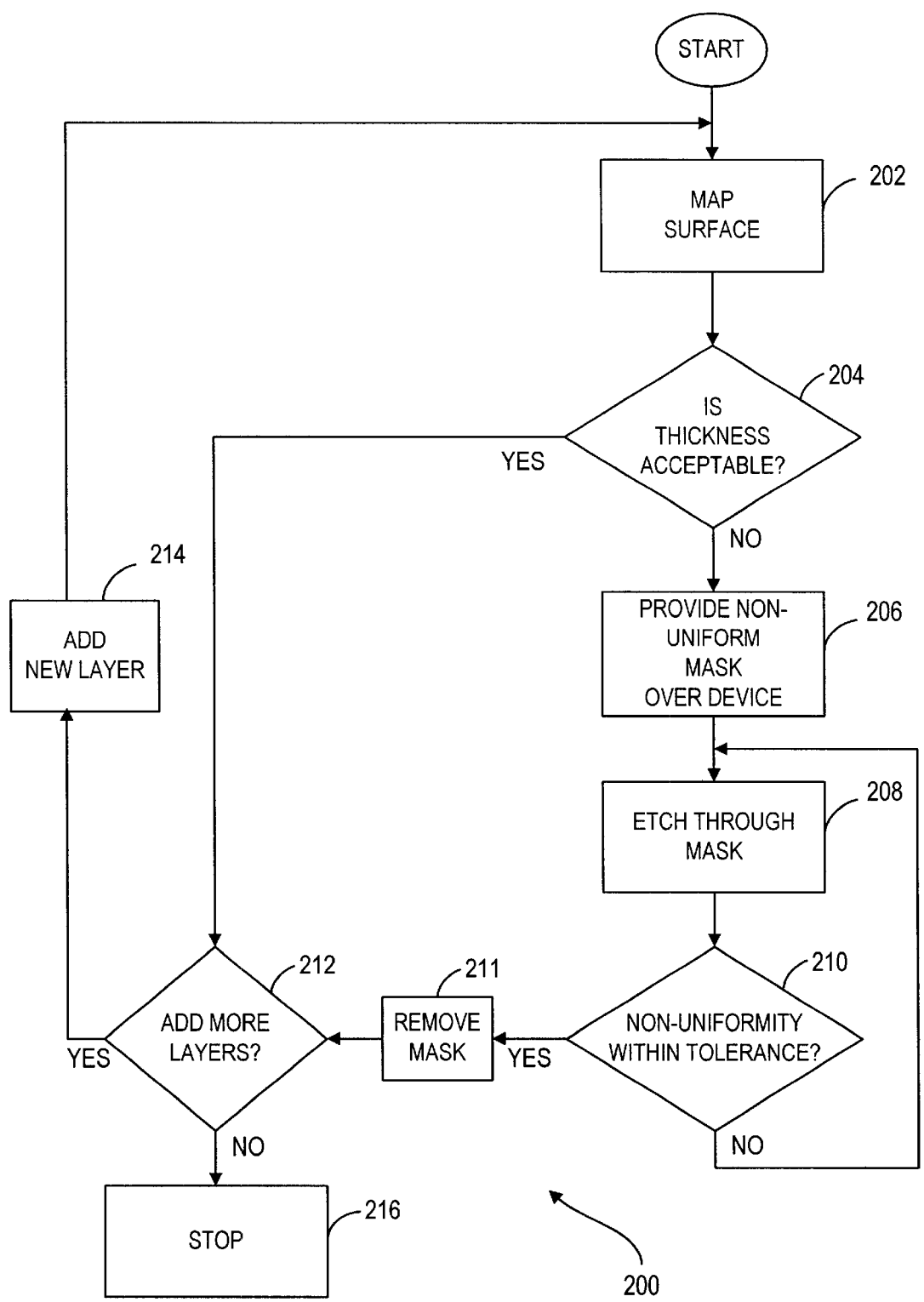
FIG. 12 is a flow chart illustrating the steps for tuning a bulk acoustic wave device, according to the present invention.

FIG. 12 is a flow chart illustrating the process 200 for tuning a bulk acoustic wave device, according to the present invention. As shown, at step 202, a frequency measurement apparatus (FIG. 10a) or a thickness measurement apparatus (FIG. 10b) is used to map the surface of the device 20. A thickness non-uniformity profile 192 is thus obtained. If the surface thickness falls within the tolerance, as determined at step 204, then new layers may be added on top of the mapped surface. Otherwise, an etching mask 44, 64 or 66 is provided over the device 20 (FIGS. 5, 8c and 9a) at step 206. An ion beam 152 (FIGS. 6a–6c, 9b and 9c) is applied over the etching mask 44, 64 or 66 to remove part of the etching mask and the top surface layer 30 (FIGS. 6a–6c, 9b and 9c) at step 208. After the thickness of the top surface layer 30 is adjusted, it is determined, at step 210, whether the thickness non-uniformity of the top surface layer 30 falls within the tolerance. If it is no longer necessary to remove more material from the top surface layer 30, the etching mask is removed at step 211. At step 212, it is determined whether more layers need to be fabricated to complete the device. After one or more new layers are added, at step 214, on top of the adjusted surface layer, the surface profile of the device is again mapped, at step 202, to determine whether the device is made according to the specification.

In summary, the present invention discloses a method and system for tuning the bulk acoustic wave device at a wafer, or die, level. The method and system, as disclosed, is particularly useful when the surface area of the wafer is sufficiently large such that the deposition of thin-film cannot achieve acceptable thickness uniformity. Trimming the frequency across the wafer by adjusting the thickness at localized areas of the wafer surface can increase the yield of the FBAR manufactory process. The thickness adjustment process can be separately and sequentially carried out to adjust at one or more layers of the FBAR-based device. If the material of the surface layer is partially removed to trim the frequency, it is preferred to use a dry etching process, such as IBE or RIBE, to trim the surface. However, other surface removal processes, such as sputtering, can be used to achieve the same objective. It is known in the art that the fabrication of the top and bottom electrode layers, in general, involves one or more additional steps to make a pattern out of each of the electrode layers. It is preferred that the patterning steps are carried out after the thickness of the respective electrode layer is adjusted. However, it is also possible to carry out the patterning steps prior to the thickness adjustment.

Figure 3:
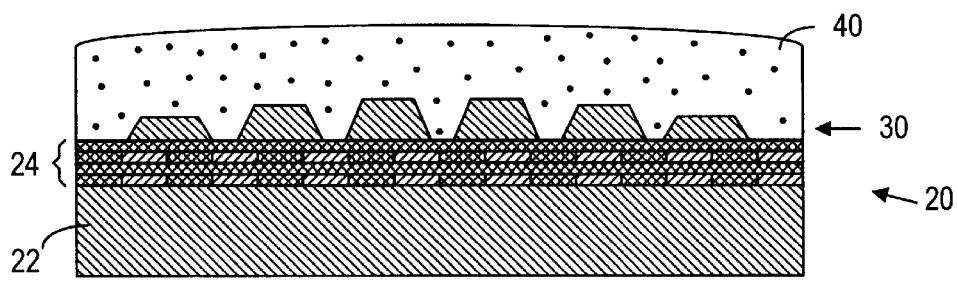
FIG. 3 is a cross sectional view illustrating a photoresist layer provided on top of the top surface layer of the device.
Figure 4:
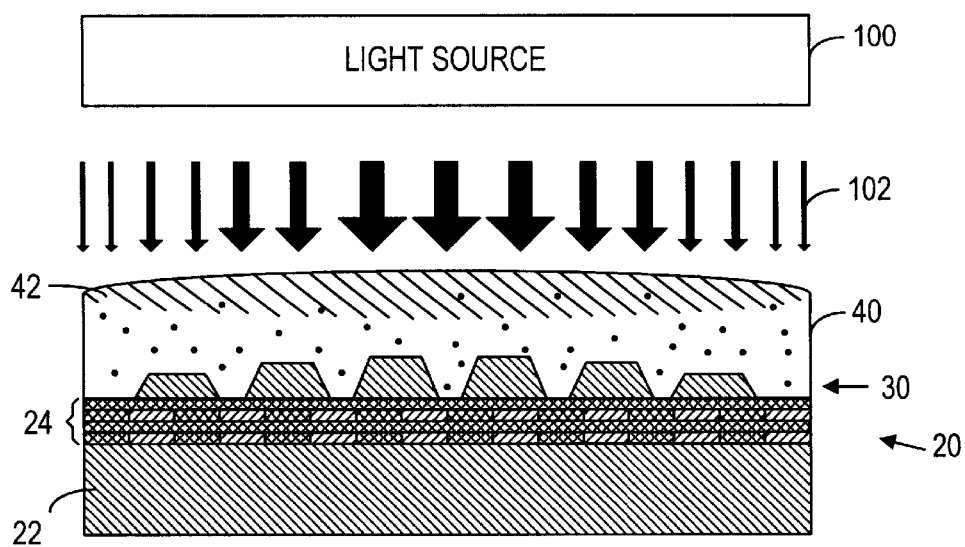
FIG. 4 is diagrammatic representation illustrating a light source having a non-uniform intensity profile to expose the photoresist material.
Figure 5:
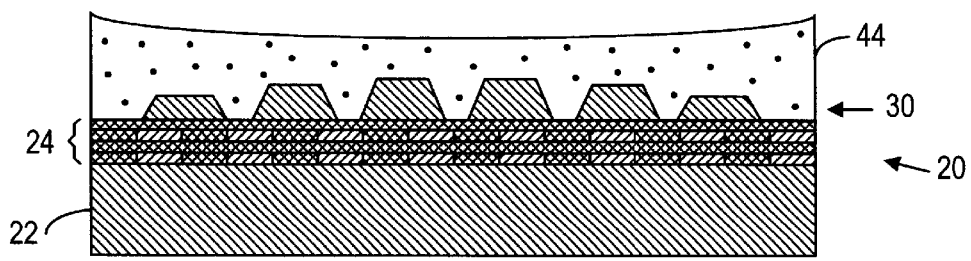
FIG. 5 is a cross sectional view illustrating an etching mask having a thickness non-uniformity profile partly based on the thickness non-uniformity of the top surface layer of the device.

As described in conjunction with FIGS. 3–5, a photoresist layer 40 is exposed to a light beam 102 having a non-uniform intensity profile to produce an etching mask 44. The exposure depth in the photoresist layer 40 at different locations must be controlled to produce an etching mask with a thickness non-uniformity profile. It is possible to introduce an appropriate amount of pigment in the photoresist material to attenuate the light beam 102, thereby controlling the penetration depth of the light beam 102 at different locations. In the photoresist layer 40, the sufficiently exposed portion 42 is removed after the photoresist layer 40 is developed and washed. The added pigment can prevent the lower section of the photoresist from being sufficiently exposed.

It is known in the art that the fabrication of the top and bottom electrode layers, in general, involves one or more additional steps to make a pattern out of each of the electrode layers. It is preferred that the patterning steps are carried out before the thickness of the respective electrode layer is adjusted. However, it is also possible to carry out the patterning steps after the thickness adjustment.

It should be noted that the bulk acoustic wave devices, according to the present invention, include individual resonators, stacked crystal filters, ladder filters and the combinations thereof. However, there are other filter types in addition to the ladder structure that can be constructed from FBARs. All of them include some resonators, which have to be tuned, but they cannot be called parallel or shunt resonators in all cases. The balanced filter is an example of such a filter type.

Furthermore, the thickness non-uniformity, as described hereinabove, is related to the frequency non-uniformity of the BAW devices on the wafer. The purpose of trimming the surface layer is to reduce the frequency non-uniformity of the devices. Thus, trimming the surface layer does not necessarily make the topmost layer perfectly even. In other words, even if the topmost layer has a very uniform thickness, it might be necessary to trim it to correct for the non-uniformity of one or more of the underlying layers. For example, if the topmost layer is a top electrode layer overlying a piezoelectric layer which is not uniform, the purpose of trimming the top electrode layer is for reducing the frequency non-uniformity of the devices due to the thickness non-uniformity of the piezoelectric layer—even if the top electrode layer itself is uniform. The object of the present invention is to achieve the desired uniformity of the final frequency of the devices. Therefore, the surface layer can be a single layer, such as the top, bottom or piezoelectric layer, but the surface layer can also be a combination of layers, such as the combination of the top electrode layer and the piezoelectric layer.

Thus, although the invention has been described with respect to a preferred embodiment thereof, it will be understood by those skilled in the art that the foregoing and various other changes, omissions and deviations in the form and detail thereof may be made without departing from the spirit and scope of this invention.

What is claimed is:

1. A method of tuning a bulk acoustic wave device comprising a substrate and a plurality of acoustic wave generating and controlling layers formed on the substrate, wherein the device has a top surface layer made of a surface material and a thickness with a thickness non-uniformity profile across the top surface layer, and wherein the device has an operating frequency which varies partly with the thickness of the top surface layer, and the operating frequency can be adjusted by adjusting the thickness of the top surface layer, said method comprising the steps of:

providing, on top of the top surface layer, a mask made of a mask material having a further non-uniformity profile partly based on the thickness non-uniformity profile of the top surface layer;

providing an etching agent over the mask for removing the mask material from at least one mask area to expose a corresponding surface area of the top surface layer to the etching agent; and removing part of surface material from the top surface layer at the exposed surface area until a desired thickness of the top surface layer is reached, while simultaneously removing the mask material to modify the exposed surface area.

2. The method of claim 1, wherein the etching agent comprises an ion beam for use in an ion beam etching process to remove the mask material and the surface material.

3. The method of claim 1, wherein the etching agent comprises a reactive ion beam for use in a reactive ion etching process to remove the mask material and the surface material.

4. The method of claim 1, wherein the etching agent comprises an ion beam for use in a chemically assisted ion beam etching process to remove the mask material and the surface material.

5. The method of claim 1, wherein the mask material comprises a photoresist material.

6. The method of claim 1, wherein the mask material comprises a dielectric material.

7. The method of claim 1, wherein the top surface layer comprises a piezoelectric layer.

8. The method of claim 1, wherein the top surface layer comprises an electrode layer.

9. The method of claim 1, wherein the top surface layer comprises a passivation layer.

10. The method of claim 1, wherein the bulk acoustic wave device comprises a film bulk acoustic wave resonator.

11. The method of claim 1, wherein the bulk acoustic wave device comprises a film bulk acoustic wave filter.

12. The method of claim 1, wherein the bulk acoustic wave device comprises a stacked crystal filter.

13. The method of claim 1, wherein the bulk acoustic wave device comprises a plurality of individual bulk acoustic device chips.

14. The method of claim 1, further comprising the step of mapping the thickness of the device for determining the thickness non-uniformity profile.

15. The method of claim 14, wherein the mapping step is carried out by measuring the resonant frequency of the device across the device surface.

16. The method of claim 14, wherein the mapping step is carried out by measuring the thickness of one of the acoustic wave generating and controlling layers.

17. The method of claim 1, wherein the thickness non-uniformity profile of the top surface layer comprises a plurality of locations at which the top surface layer requires thickness adjustment, and the mask has a plurality of sections corresponding to said plurality of locations, wherein the mask material is selectively removed at said plurality of sections to provide the further non-uniformity profile of the mask.

18. The method of claim 17, wherein the mask material is selectively removed at said plurality of sections by a laser beam, one section at a time.

19. A system for tuning a bulk acoustic wave device comprising a substrate and a plurality of acoustic wave generating and controlling layers formed on the substrate, wherein the device has a top surface layer made of a surface material and a thickness with a thickness non-uniformity profile across the top surface layer, and wherein the bulk acoustic wave device has an operating frequency, which varies partly with a thickness of the top surface layer, and the operating frequency can be adjusted by adjusting the thickness of the top surface layer through a mask made of a mask material provided on top of the top surface layer, the system comprises:
  means, positioned above the device, for removing the mask material for providing a further non-uniformity profile of the mask, partly based on the thickness non-uniformity of the top surface layer; and
  means, positioned above the mask, for providing an etching agent over the mask for removing the mask material from at least one mask area to expose a corresponding surface area of the top surface layer to the etching agent, and for removing part of the surface material from the top surface layer at the exposed surface area until a desired thickness of the top surface layer is reached, while simultaneously removing the mask material to modify the exposed surface area.

20. The system of claim 19, wherein the mask material is a photoresist material, said system further comprising a light source for exposing the photoresist material, wherein the light source has a non-uniformity intensity profile to control exposure depth of the photoresist material across the device surface.

21. The system of claim 19, wherein the mask material is a photoresist material, said system further comprising a light source for exposing the photoresist material, wherein the photoresist material comprises a light absorbing material to attenuate the light source for controlling penetration depth of the light source at different locations.

22. The system of claim 19, wherein the mask material is a dielectric material, said system further comprising a laser beam for removing the dielectric material, wherein the laser beam has a non-uniformity intensity profile to control the removal of the dielectric material across the device surface.

23. The system of claim 19, wherein the mask material is a dielectric material, said system further comprising a laser beam for removing the dielectric material at one location of the mask at a time, and a scanning mechanism to move the laser beam in a lateral direction relative to the device surface to other locations.

24. The system of claim 19, wherein the mask material is a dielectric material, said system further comprising a particle source for providing a particle beam for removing the dielectric material according to the further non-uniformity profile of the mask.

25. The system of claim 19, wherein the non-uniformity of the top surface layer comprises a plurality of locations at which the top surface layer requires thickness adjustment, and the mask has plurality of sections corresponding to said plurality of locations, said system further comprising a laser beam for selectively removing the mask material at said plurality of sections of the mask, one section at a time, for providing the further non-uniformity profile of the mask.

26. The system of claim 19, further comprising a mapping mechanism for obtaining the non-uniformity profile of the top surface layer.

27. The system of claim 19, further comprising a frequency measurement device for mapping the thickness non-uniformity profile of the top surface layer.

* * * * *

UNITED STATES PATENT AND TRADEMARK OFFICE
CERTIFICATE OF CORRECTION

PATENT NO. : 6,441,702 B1
DATED : August 27, 2002
INVENTOR(S) : Ellä et al.

It is certified that error appears in the above-identified patent and that said Letters Patent is hereby corrected as shown below:

Column 7,
Line 63, after "exposing", please delete ".".

Signed and Sealed this

Eleventh Day of February, 2003

JAMES E. ROGAN
*Director of the United States Patent and Trademark Office*